(12) United States Patent
Davis

(10) Patent No.: US 6,677,291 B2
(45) Date of Patent: Jan. 13, 2004

(54) CLEANING SOLVENT AND DISPENSER

(75) Inventor: Milton J. Davis, Riverdale, GA (US)

(73) Assignee: Illinois Tool Works, Inc., Glenview, IL (US)

( * ) Notice: Subject to any disclaimer, the term of this patent is extended or adjusted under 35 U.S.C. 154(b) by 205 days.

(21) Appl. No.: 10/043,913

(22) Filed: Jan. 11, 2002

(65) Prior Publication Data

US 2003/0134767 A1 Jul. 17, 2003

(51) Int. Cl.[7] ................................................. C11D 3/44
(52) U.S. Cl. ........................ 510/407; 510/410; 510/417; 510/365; 510/421; 134/33; 134/40
(58) Field of Search .................................. 510/407, 410, 510/417, 365, 432, 177, 175, 505, 421; 134/38, 40

(56) References Cited

U.S. PATENT DOCUMENTS 4,694,059 A * 9/1987 Veazey

FOREIGN PATENT DOCUMENTS

JP 07292390 * 11/1995

* cited by examiner

Primary Examiner—Gregory Webb
(74) Attorney, Agent, or Firm—Mark W. Croll, Esq.; Donald J. Breh, Esq.; Welsh & Katz, Ltd.

(57) ABSTRACT

A liquid cleaning solvent is formulated from a terpene hydrocarbon present in a concentration of about 50 percent to about 80 percent of the cleaning solvent and tetrahydrofuran compatible with the terpene hydrocarbon present in a concentration of about 20 percent to about 50 percent of the cleaning solvent. The liquid cleaning solvent is provided in a dispensing pen for ease of application.

6 Claims, 1 Drawing Sheet

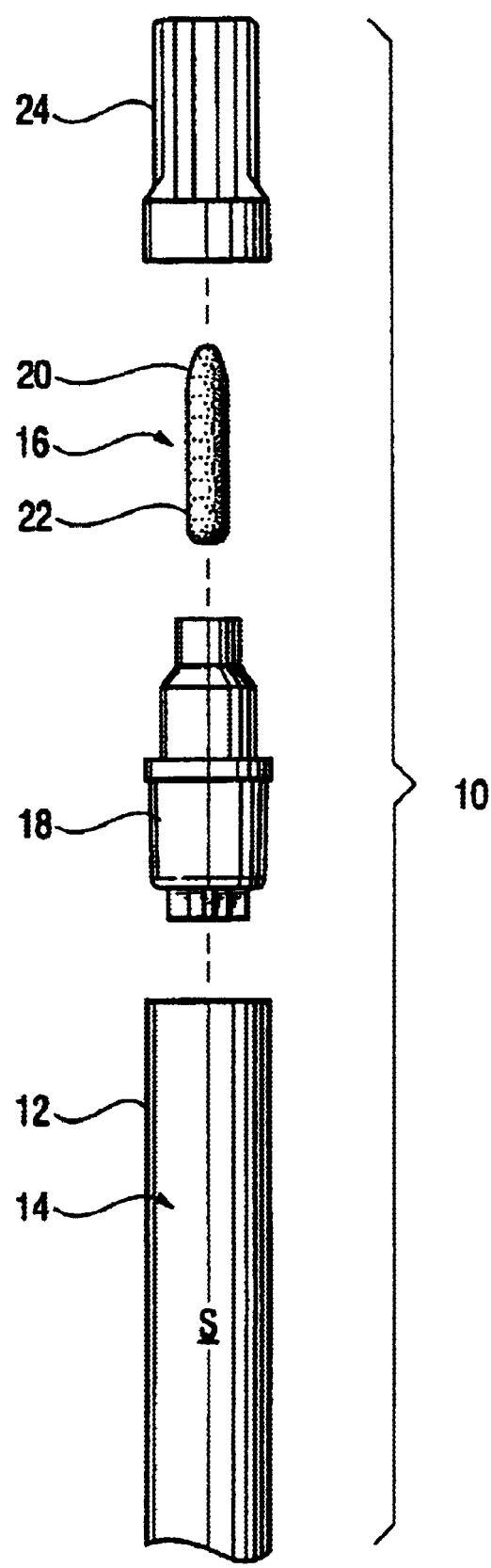

CLEANING SOLVENT AND DISPENSER

BACKGROUND OF THE INVENTION

The present invention is directed to a cleaning solvent. More particularly, the present invention is directed to a readily applyable cleaning solvent and a dispenser, in pen form, for use in applying the solvent.

A wide variety of solvents are available for commercial, as well as non-commercial uses. Many of these known solvent cleaners are quite aggressive and thus cannot be used on many plastic or other polymeric materials. It has been found that these materials can tend to degrade the plastic thus resulting in structural failure of the plastic, aesthetic and like failures. Other types of cleaning solvents are ineffective and, as such, provide little to no efficacy.

It has also been found that many of the known solvents do not have a wide usage range period. That is, while one particular type of solvent may be quite useful to, for example, remove gum or labels (e.g., glue-removal), this same solvent may not be useful to, for example remove and industrial coatings. On the other hand, a solvent that is useful in removing industrial coatings may be too aggressive for use in glue removal.

It has also been found that many such cleaning solvents are not available in a readily usable container. That is, such solvents may be spray applied or brush applied or merely provided in a container, such as a metal can. Those who have used such solvents will recognize that spray applicators may not be useful in certain situations to, for example, remove small areas of glue. On the other hand, brush applicators may not be useful where a very specific or discrete location requires application of the solvent.

One known solvent is available in a pen-type dispenser. The solvent is formulated from d-limonene and is commercially available from Micro Care Corporation of Bristol, Conn. under the trademark Tidy Pen®.

Accordingly, there exists a need for a cleaning solvent that can be used in a wide variety of applications from glue removal to coating removal. More desirably, such a solvent is provided in a readily usable dispenser.

BRIEF SUMMARY OF THE INVENTION

A liquid cleaning solvent is formulated from a terpene hydrocarbon present in a concentration of about 50 percent to about 80 percent of the cleaning solvent and tetrahydrofuran compatible with the terpene hydrocarbon present in a concentration of about 20 percent to about 50 percent of the cleaning solvent.

A preferred terpene hydrocarbon is d-limonene. Preferably, the liquid cleaning solvent includes butylated hydroxy toluene present in a concentration of less than about 1 percent of the cleaning solvent. Most preferably, the butylated hydroxy toluene is present in a concentration of less than about 0.1 percent of the cleaning solvent A preferred solvent is provided within a dispenser. A preferred dispenser is a pen dispenser.

These and other features and advantages of the present invention will be apparent from the following detailed description, in conjunction with the appended claims.

BRIEF DESCRIPTION OF THE SEVERAL VIEWS OF THE DRAWINGS

The benefits and advantages of the present invention will become more readily apparent to those of ordinary skill in the relevant art after reviewing the following detailed description and accompanying drawings, wherein:

FIG. 1 is an exploded view of an exemplary pen for use with the liquid cleaning solvent embodying the principles of the present invention.

DETAILED DESCRIPTION OF THE INVENTION

While the present invention is susceptible of embodiment in various forms, there is shown in the drawings and will hereinafter be described a presently preferred embodiment with the understanding that the present disclosure is to be considered an exemplification of the invention and is not intended to limit the invention to the specific embodiment illustrated. It should be further understood that the title of this section of this specification, namely, "Detailed Description Of The Invention", relates to a requirement of the United States Patent Office, and does not imply, nor should be inferred to limit the subject matter disclosed herein.

In the present disclosure, the words "a" or "an" are to be taken to include both the singular and the plural. Conversely, any reference to plural items shall, where appropriate, include the singular.

A present liquid cleaning solvent includes a terpene hydrocarbon present in a concentration of about 50 percent to about 80 percent of the cleaning solvent and a tetrahydrofuran ("THF") compatible with the terpene hydrocarbon. The tetrahydorfuran is present in a concentration of about 20 percent to about 50 percent of the cleaning solvent. In a present solvent, the THF is inhibited with butylated hydroxy toluene in a concentration of less that about 0.1 percent of the THF.

In a present cleaning solvent, the terpene hydrocarbon is a D-limonene. Referring now to the figures and in particular to FIG. 1 there is shown a cleaning device 10 having liquid cleaning solvent embodying the principles of the present invention. The cleaning device 10 illustrated is a pen dispenser, which will be discussed in more detail below.

A liquid cleaning solvent in accordance with the present invention has been found to be useful for a wide range of applications. For example, it has been found that present liquid cleaning solvent is useful in applications as straight forward as glue removal to, for example, remove the glue that may remain after a label has been removed from an object. It has also been found that the present liquid cleaning solvent can be used in applications which require more aggressive solvent characteristics. For example, it has been found that the present solvent works well to remove conformal coatings. Those skilled in the art will recognize that conformal coatings are those coatings that are applied to circuit boards to provide protection for the circuit board assembly (including the solid state devices thereon) from environmental exposure.

It will also be recognized that in order to perform any necessary maintenance on the circuit board, e.g. to remove and replace components, these conformal coatings must be fully removed from the area of interest on the circuit board. Conformal coatings include various types of protectants. Typically, conformal coatings are acrylic based, urethane based or silicone-based compounds. It has been found that the acrylic based compounds provide good dielectric protection, the urethane based coatings exhibit good overall toughness and typically cannot be removed, while the silicone based coatings provide good protection from environmental elements.

It has been found that the present liquid cleaning solvent exhibits good "removal" characteristics for each of these types of conformal coatings.

Those skilled in the art will recognize that the THF is a strongly aggressive solvent, and has a correspondingly strong odor associated with it. As such, it is often necessary to use THF in non-confined or ventilated areas. In addition, polypropylene, polyvinyl chloride (PVC), silicone rubber, Teflon® and Viton®.

TABLE 1

CLEANING SOLVENT/PLASTICS COMPATIBILITY

| Plastic Type | Initial Wt. | Final Wt. | Wt. Change | Initial Thickness | Final Thickness | Thickness Change | Initial Width | Final Width | Width Change | Ranking |
|---|---|---|---|---|---|---|---|---|---|---|
| ABS | 0.6524 | 0.6704 | 3% | 0.0655 | 0.0675 | 3% | 0.5065 | 0.5085 | 0% | 5-Good |
| Buna-N | 0.8104 | 0.9531 | 18% | 0.067 | 0.073 | 8% | 0.4995 | 0.5335 | 7% | 1-Poor |
| EPDM | 1.4516 | 1.6867 | 16% | 0.126 | 0.1345 | 7% | 0.508 | 0.5245 | 3% | 1-Poor |
| Graphite | 1.9045 | 1.9045 | 0% | 0.129 | 0.129 | 0% | 0.5115 | 0.5115 | 0% | 10-Excellent |
| Lexan | 2.065 | 2.07 | 0% | 0.216 | 0.216 | 0% | 0.5035 | 0.5035 | 0% | 10-Excellent |
| Neoprene | 1.3316 | 1.5278 | 15% | 0.1195 | 0.131 | 10% | 0.4945 | 0.5205 | 5% | 1-Poor |
| Noryl | 1.009 | 1.1262 | 12% | 0.12 | 0.1245 | 4% | 0.514 | 0.514 | 0% | 5-Good |
| Polypropylene | 0.4766 | 0.477 | 0% | 0.0045 | 0.0645 | 0% | 0.5015 | 0.5045 | 0% | 10-Excellent |
| PVC | 0.7153 | 0.7158 | 0% | 0.063 | 0.063 | 0% | 0.504 | 0.504 | 0% | 10-Excellent |
| Silicone Rubber | 0.7021 | 0.9721 | 38% | 0.0655 | 0.077 | 18% | 0.5045 | 0.576 | 14% | 1-Poor |
| Teflon | 2.3291 | 2.3294 | 0% | 0.1285 | 0.1285 | 0% | 0.4955 | 0.4955 | 0% | 10-Excellent |
| Viton | 1.8256 | 1.8283 | 0% | 0.1215 | 0.1215 | 0% | 0.4925 | 0.494 | 0% | 10-Excellent | this strong odor discourages use of this solvent in other than commercial applications.

On the other hand, it will also be recognized that the terpene hydrocarbons generally have less aggressive solvent characteristics, as well as less offensive odors. In that many such terpenes are formed from essential oils or resins and balsams, these oils are often found to be rather "fragrant". That is, these oils can have fragrances ranging from conifer like to citrus like. As such, these solvents are more attractive for use in a non-commercial setting. However, one drawback to these solvents is there that their solvent characteristics, e.g., strength, are less than optimal.

To this end, it has been found that a certain mixture of a terpene hydrocarbon and THF provide the requisite aggressiveness desired in commercial as well as non-commercial solvents, while maintaining a more pleasing fragrance (or less offensive odor). It has been found that a cleaning solvent having a terpene concentration of about 50 percent to about 80 percent of the cleaning solvent and THF in a concentration of about 20 percent to about 50 percent of the cleaning solvent provides the requisite aggressiveness of a solvent, while maintaining a pleasing fragrance. In a preferred cleaning solvent, the terpene, preferably d-limonene, is present in concentration of about 80 percent of the cleaning solvent and the THF is present in a concentration of about 20 percent of the cleaning solvent. In a most preferred cleaning solvent, the THF is inhibited with butylated hydroxy toluene in a concentration of less that about 1 percent, and most preferably, in a concentration of less than about 0.1 percent of the THF.

Various plastics were evaluated to determine whether a cleaning solvent embodying the principals of the present invention, when applied to the plastics resulted in unacceptable levels of degradation of the plastic. In these evaluations, samples of each plastic measuring one-inch by (varying widths and thickness) were immersed in the liquid cleaning solvent for a period of 15 minutes. The samples were then allowed to dry and final measurements were taken. Rankings were then assigned to each of the samples based upon the PDL resistance rating chart. Table 1 below summarizes the results of these evaluations.

The samples evaluated include: acrylonitrile butadiene styrene (ABS), Buna-N, ethylene propylene diene monomer (EPDM), graphite, Lexan®, neoprene, Noryl®, In TABLE 1 above, the first column represents the type of plastic evaluated. In certain instances, commercial or trade names (trademarks) are shown, rather than generic chemical nomenclature/names for ease of recognition. The second, third and fourth columns illustrate data representing the initial and final weights and weight change, in percent (%), before and after immersion in the present liquid cleaning solvent. The data in columns four, five and six represent the initial and final sample thicknesses and the change in thickness, and the data in columns seven, eight and nine represent the initial and final widths and change in width, again, before and after immersion. The tenth column is a ranking based upon the compatibility or acceptability of the sample, in which the sample were assigned a ranking of 1 (poor compatibility or acceptability), 5 (good compatibility or acceptability) or 10 (excellent compatibility or acceptability).

As can be seen from the data of TABLE 1, there is a wide variety of plastics that exhibit excellent or good compatibility with the present cleaning solvent. Notably, only Buna-N, EPDM, neoprene and silicone rubber exhibited unacceptable rankings (rankings of 1), whereas all of the other plastics evaluated exhibited acceptable compatibility with the present cleaning solvent. Also notably, graphite, Lexan®, polypropylene, PVC, Teflon® and Viton® all exhibited exceptional characteristics, vis, essentially zero percent (0%) change in weight, thickness and width of the samples.

Returning again to FIG. 1, a dispensing pen 10 for use with the present liquid cleaning solvent S is of a known design. The pen 10 includes a body 12 defining a sealed chamber 14 in which the cleaning solvent S is stored. A nib 16 is formed from a porous material, such as felt, and is mounted to the body 12 by a biased valve assembly 18. The nib 16 has a marking end 20 and a supply end 22 from which the solvent S is supplied to the marking end 20. A typical pen 10 includes a cap 24 to prevent the pen 10 from drying out. Such a marking pen 10 is commercially available from ITW Mark-Tex of Roseland, N.J.

The nib 16 is biased to an outward position in which it extends outwardly from the body 12 and valve assembly 18. The supply end 22 of the nib 16 is positioned in the valve assembly 18. When a (downward) pressure is applied to the nib 16, the nib 16 urges the valve assembly 18 open which permits the solvent S to flow from the chamber 14, into the valve 18 and into contact with the nib supply end 22. This saturates the nib 16 with the solvent S which flows through the nib 16 to the marking end 20. Contact of the marking end 20 with an item, thus results in applying the solvent S to that particular desired area of the item.

From the foregoing it will be observed that numerous modifications and variations can be effectuated without departing from the true spirit and scope of the novel concepts of the present invention. It is to be understood that no limitation with respect to the specific embodiments illustrated is intended or should be inferred. The disclosure is intended to cover by the appended claims all such modifications as fall within the scope of the claims.

What is claimed is:

1. A liquid cleaning solvent comprising:
   a terpene hydrocarbon present in a concentration of about 50 percent to about 80 percent of the cleaning solvent;
   tetrahydrofuran compatible with the terpene hydrocarbon present in a concentration of about 20 percent to about 50 percent of the cleaning solvent; and butylated hydroxy toluene.

2. The liquid cleaning solvent in accordance with claim 1 wherein the terpene hydrocarbon is d-limonene.

3. The liquid cleaning solvent in accordance with claim 1 wherein the butylated hydroxy toluene is present in a concentration of less than about 1 percent of the tetrahydrofuran.

4. The liquid cleaning solvent in accordance with claim 3 wherein the butylated hydroxy toluene is present in a concentration of less than about 0.1 percent of the tetrahydrofuran.

5. The liquid cleaning solvent in accordance with claim 1 wherein the solvent is contained within a dispenser.

6. The liquid cleaning solvent in accordance with claim 3 wherein the dispenser is a pen dispenser.

* * * * *